US007533328B2

(12) United States Patent
Alrod et al.

(10) Patent No.: US 7,533,328 B2
(45) Date of Patent: May 12, 2009

(54) METHOD OF ERROR CORRECTION IN A MULTI-BIT-PER-CELL FLASH MEMORY

(75) Inventors: Idan Alrod, Tel Aviv (IL); Eran Sharon, Rishon Lezion (IL); Simon Litsyn, Giv'at Shmuel (IL)

(73) Assignee: SanDisk IL, Ltd., Kfar Saba (IL)

( * ) Notice: Subject to any disclaimer, the term of this patent is extended or adjusted under 35 U.S.C. 154(b) by 135 days.

(21) Appl. No.: 11/607,945

(22) Filed: Dec. 4, 2006

(65) Prior Publication Data
US 2008/0010581 A1    Jan. 10, 2008

Related U.S. Application Data

(60) Provisional application No. 60/806,534, filed on Jul. 4, 2006.

(51) Int. Cl.
*H03M 13/03*    (2006.01)
(52) U.S. Cl. .................................................... 714/786
(58) Field of Classification Search ................. 714/755, 714/786, 794–796, 375, 340, 386, 46, 124, 714/714, 746
See application file for complete search history.

(56) References Cited

U.S. PATENT DOCUMENTS

| | | | |
|---|---|---|---|
| 5,404,485 A | 4/1995 | Ban | 711/202 |
| 5,434,825 A | 7/1995 | Harari | 365/185.24 |
| 6,522,580 B2 | 2/2003 | Chen et al. | 365/185.02 |
| 6,614,858 B1 * | 9/2003 | Pekarich et al. | 375/340 |
| 6,643,188 B2 | 11/2003 | Tanaka et al. | 365/189.16 |
| 6,760,879 B2 * | 7/2004 | Giese et al. | 714/755 |
| 6,885,711 B2 * | 4/2005 | Shiu et al. | 375/340 |

OTHER PUBLICATIONS

U.S. Appl. No. 11/339,571, filed Jan. 26, 2006, Litsyn et al.
S. Lin and DJ Costello, "Error Control Coding" Prentice-Hall, 2004.
C. Berrou and A. Glavieux Near Optimum Error Correcting Coding and Decoding: Turbo-Codes, IEEE Trans. Com, vol. 44, N 10, pp. 1261-1271, Oct. 1996.
R.M. Pyndiah, "Near-Optimum Decoding of Product Codes", IEEE Trans. Com. , vol. 46, pp. 1003-1010, Aug. 1998.
R.G. Gallager, Low-Density parity-check Codes, IRE Trans. Info. Theory, vol. IT-8, pp. 21-28, 1962.

* cited by examiner

*Primary Examiner*—Shelly A Chase
(74) *Attorney, Agent, or Firm*—Mark M. Friedman

(57) ABSTRACT

Data are encoded as a systematic or nonsystematic codeword that is stored in a memory such as a flash memory. A representation of the codeword is read from the memory. A plurality of bits related to the representation of the codeword is decoded iteratively. The plurality of bits could be, for example, part or all of the representation of the codeword itself or part or all of the results of preliminary processing of part or all of the representation of the codeword.

42 Claims, 4 Drawing Sheets

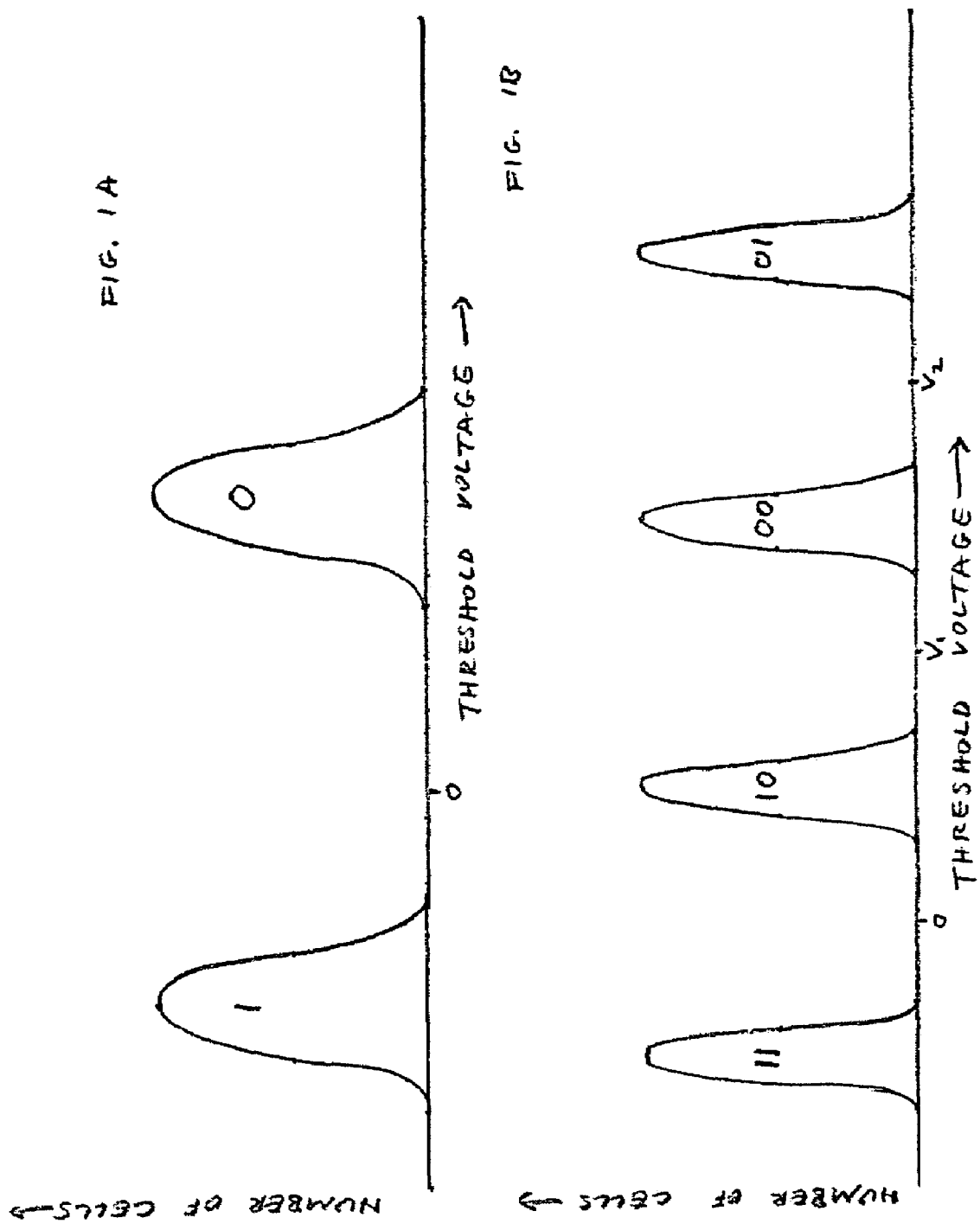

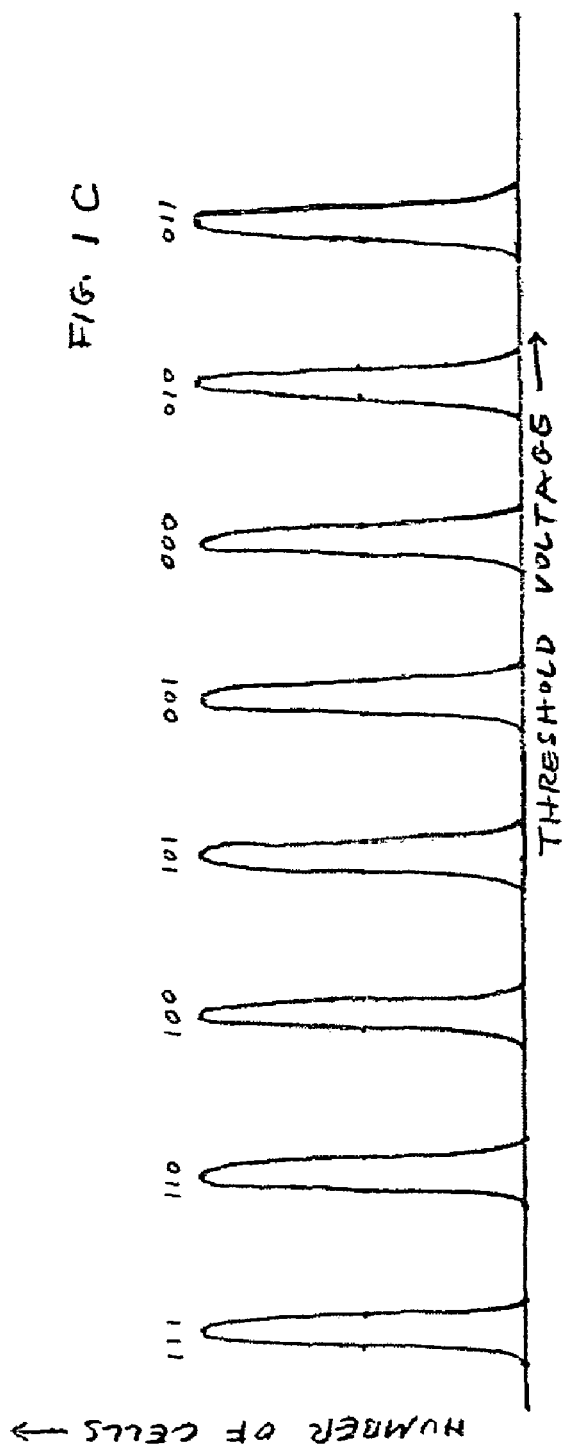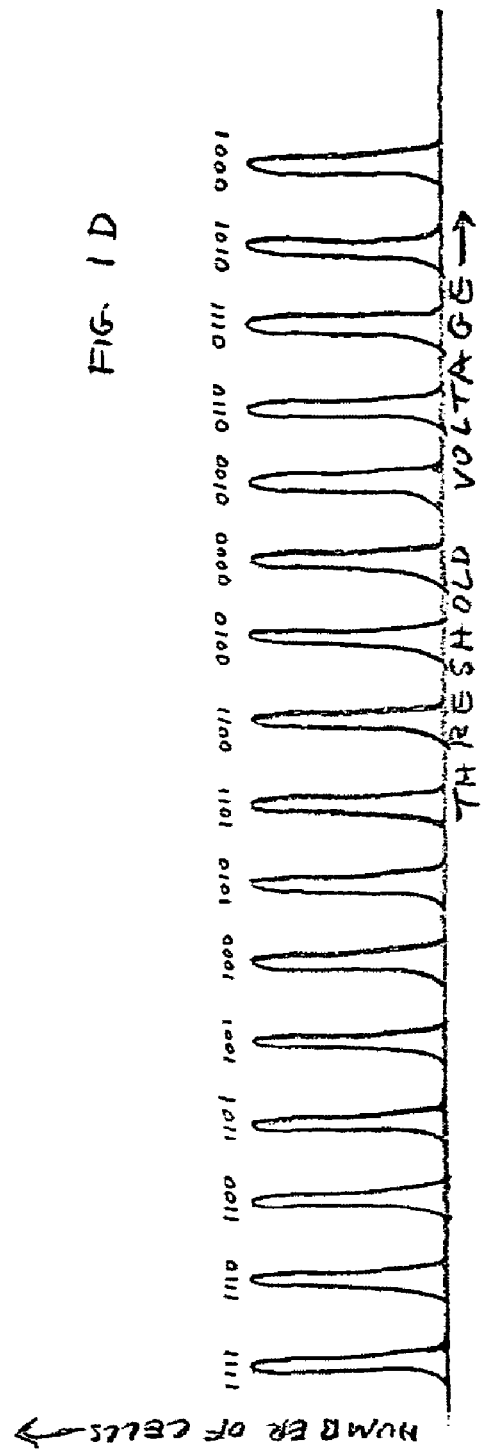

METHOD OF ERROR CORRECTION IN A MULTI-BIT-PER-CELL FLASH MEMORY

This patent application claims the benefit of U.S. Provisional Patent Application No. 60/806,534, filed Jul. 4, 2006

FIELD AND BACKGROUND OF THE INVENTION

The present invention relates to error correction of digital data and, more particularly, to a method of error correction for flash memory devices that store multiple bits per cell.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell: if the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For that purpose it is enough to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash memory are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash memory has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two or more bits in each cell. In order for a single cell to store two bits of information the cell must be able to be in one of four different states. As the cell's "state" is represented by its threshold voltage, it is clear that a 2-bit MBC cell should support four different valid ranges for its threshold voltage. FIG. 1B shows the threshold voltage distribution for a typical 2-bit MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash memory see U.S. Pat. No. 5,434,825 to Harari.

Similarly, in order for a single cell to store three bits of information the cell must be able to be in one of eight different states. So a 3-bit MBC cell should support eight different valid ranges for its threshold voltage. FIG. 1C shows the threshold voltage distribution for a typical 3-bit MBC cell. As expected, FIG. 1C has eight peaks, each corresponding to one state. FIG. 1D shows the threshold voltage distribution for a 4-bit MBC cell, for which sixteen states, represented by sixteen threshold voltage ranges, are required.

When encoding two bits in an MBC cell via the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right: "10", "00", "01". One can see an example of an implementation of an MBC NAND flash memory using this encoding in U.S. Pat. No. 6,522,580 to Chen, which patent is incorporated by reference for all purposes as if fully set forth herein. See in particular FIG. 8 of the Chen patent. U.S. Pat. No. 6,643,188 to Tanaka also shows a similar implementation of an MBC NAND flash memory, but see FIG. 7 there for a different assignment of the states to bit encodings: "11", "10", "01", "00". The Chen encoding is the one illustrated in FIG. 1B.

We extend the above terminology and notation to the cases of more than two bits per cell, as follows. The left-most unwritten state represents "all ones" ("1 . . . 1"), the string "1 . . . 10" represents the case of only the lowest bit of the cell being written to "0", and the string "01 . . . 1" represents the case of only the most upper bit of the cell being written to "0".

When reading an MBC cell's content, the range that the cell's threshold voltage is in must be identified correctly; only in this case this cannot always be achieved by comparing to only one reference voltage. Instead, several comparisons may be necessary. For example, in the case illustrated in FIG. 1B, to read the lower bit, the cell's threshold voltage first is compared to a reference comparison voltage $V_1$ and then, depending on the outcome of the comparison, to either a zero reference comparison voltage or a reference comparison voltage $V_2$. Alternatively, the lower bit is read by unconditionally comparing the threshold voltage to both a zero reference voltage and a reference comparison voltage $V_2$, again requiring two comparisons. For more than two bits per cell, even more comparisons might be required.

Denote a page in the flash memory as the smallest portion of data that can be separately written into the flash memory, then the bits of a single MBC cell may all belong to the same flash page, or these bits may be assigned to different pages so that, for example in a 4-bit per cell flash memory, the lowest bit is in page 0, the next bit is in page 1, the next bit in page 2, and the highest bit is in page 3.

MBC devices provide a significant cost advantage. An MBC device with two bits per cell requires about half the area of a silicon wafer required by an SBC of similar capacity. However, there are drawbacks to using MBC flash. Average read and write times of MBC memories are longer than of SBC memories, resulting in reduced performance. More importantly, the reliability of MBC is lower than SBC. The difference between the threshold voltage ranges in MBC are much smaller than in SBC. Thus, a disturbance in the threshold voltage (e.g. leakage of stored charge causing a threshold voltage drift or interference from operating neighboring cells), that are insignificant in SBC because of the large gap between the two states, may cause an MBC cell to move from one state to another, resulting in an erroneous bit. The end result is a lower performance specification of MBC cells in terms of data retention time or in terms of the endurance of the device to many write/erase cycles.

Flash memory cells, and especially flash memory cells of the NAND-type, have a non-zero probability of providing erroneous bits when read out. In other words—there is a non-zero (even though small) probability that when writing a specific bit of data into the flash memory device and later reading the bit out of the device, the read value of the bit will not be equal to the previously written value. This fact is typically explicitly stated in the datasheets of NAND-type flash memory devices, and the manufacturer usually provides a recommendation for the amount of error correction that should be applied to the data being read. For SBC flash memory devices it is typical for the manufacturer to recommend the use of an Error Correction Code (ECC) capable of correcting one bit error per each sector of 512 bytes of user data. For 2-bit-per-cell MBC flash memory devices it is typical for the manufacturer to recommend the use of an ECC capable of correcting four bit errors per each sector of 512 bytes of user data. This is in line with the previous observation that MBC cells are less reliable than SBC cells.

Error Correction Code implementations include two parts. The first part is called the "encoder" and is activated when writing the data into the memory. The encoder receives the user data as an input, and outputs a "codeword" that is a representation of the user data plus some extra information that will allow overcoming errors in the data should these errors occur. The second part is called the "decoder" and is activated when data are read from the flash memory device. The decoder receives the bits read out from the memory cells. Those bits should ideally be identical to the codeword previously stored, but in reality those bits might include erroneous bits. The decoder's task is then to use the extra information placed in the codeword by the encoder to recover the correct user bits.

ECC decoders can be classified into two types:
a. Iterative decoders
b. Non-iterative decoders For the purpose of the present invention, iterative decoders are defined as decoders that carry out a decoding algorithm in which a potential value of the decoded user data are generated by the algorithm and tested against a success criterion. If the success criterion is met, the potential value is made the decoded user data. If the success criterion is not met, the algorithm goes into another computation which results in a new potential value of the decoded user data, which in turn is tested against the success criterion according to the above decision logic. Non-iterative decoders are all decoders that are not iterative decoders. It should be noted that both iterative and non-iterative decoders may be implemented in hardware, in software, or in a combination of hardware and software, and all types of implementations are within the scope of the terms "iterative decoder" and "non-iterative decoder".

Iterative decoders are typically more complex to implement than non-iterative decoders. On the other hand, the error correction capabilities of iterative decoders usually are superior to the error correction capabilities of non-iterative decoders.

As explained above, iterative decoders process information in iterations, using the output of one iteration as the input to the next iteration. To make this approach work an iterative code is typically constructed from simpler constituent codes. There are several families of codes that can be efficiently decoded by the iterative procedure. The most popular ones are Convolutional Turbo Codes (CTC), Turbo Product Codes (TPC), and Low Density Parity-Check (LDPC) codes. In CTC the constituent codes are convolutional codes, in TPC the constituent codes are simple block codes (e.g. parity-check, Hamming, two-error correcting BCH codes), and in LDPC codes the constituent codes are short parity-check and repetition codes.

For a survey of iterative schemes see S. Lin and D. J. Costello, *Error Control Coding*, Prentice-Hall, 2004.

Detailed description of CTC can be found in C. Berrou and A. Glavieux, "Near optimum error correcting coding and decoding: Turbo-codes", *IEEE Trans. Com.*, Vol. 44, No. 10, pp. 1261-1271, October 1996.

TPC codes are treated in R. M. Pyndiah, "Near-optimum decoding of product codes: Block turbo codes", *IEEE Trans. Com.*, vol. 46, pp. 1003-1010, August 1998.

LDPC codes are described in R. G. Gallager, "Low-density parity-check codes", *IRE Trans. Info. Theory*, vol. IT-8, pp. 21-28, 1962.

At the present time, iterative decoding is used only in communication, and not in data storage applications. In particular, there are no flash memory systems that employ iterative decoders for correcting errors in data read from the flash memory. This is not surprising, given the relatively high implementation costs of iterative decoders.

As of the present time there are no commercially available MBC flash memory devices with more than two bits per cell. The major obstacle preventing such devices from becoming available is the poor reliability of the data read out of the cells of these memory devices. For example, with existing flash memory manufacturing technologies, MBC cells storing four bits per cell may output very unreliable data that requires an ECC capable of correcting hundreds of bit errors.

There is thus a need to find a way of making MBC flash memory devices with more than two bits per cell useful in spite of the large number of errors that these devices introduce into the data read out of them.

SUMMARY OF THE INVENTION

One conceptual innovation of the present invention is that, contrary to the conventional wisdom, iterative decoding is of practical use, not only in communication, but also in data storage. For example, iterative decoding of data stored in a flash memory device makes storing three or more bits per cell in the memory of such a device commercially viable.

Therefore, according to the present invention there is provided a method of processing a representation of a stored codeword, including the steps of: (a) reading the representation of the codeword from a memory wherein the stored codeword is stored; and (b) iteratively decoding a plurality of bits related to the representation of the stored codeword.

Furthermore, according to the present invention there is provided a controller, of a memory wherein is stored a representation of a codeword, the controller being operative to iteratively decode a plurality of bits related to the representation of the codeword.

Furthermore, according to the present invention there is provided a memory device including: (a) a memory for storing a representation of a codeword; and (b) a controller operative to iteratively decode a plurality of bits related to the representation of the codeword.

Furthermore, according to the present invention there is provided a system for storing data, including: (a) a memory device for storing the data as a representation of a codeword; and (b) a processor operative to iteratively decode a plurality of bits related to the representation of the codeword.

Furthermore, according to the present invention there is provided a method of processing data, including the steps of: (a) encoding the data as a codeword; (b) storing the codeword in a memory; (c) reading a representation of the codeword from the memory; and (d) iteratively decoding a plurality of bits related to the representation of the codeword.

According to a first basic method of the present invention, after a codeword is stored in a memory such as a flash memory, a representation of the stored codeword is read from the memory. What is read from the memory is only a "representation" of the stored codeword because errors in reading the stored codeword, or even instabilities of the memory that change bits of the stored codeword after the codeword has been stored, may cause some of the bits as read to be different from the bits of the codeword as originally stored. Then a plurality of bits related to the representation of the stored codeword is decoded iteratively. In the present context, "iterative decoding" means applying at least one iteration of an iterative decoding algorithm to some input.

The plurality of bits related to the representation of the stored codeword could be part or all of the stored codeword itself or could be part or all of the results of processing part or all of the stored codeword. For example, the plurality of bits related to the representation of the stored codeword could be the output of pre-processing part or all of the representation of the stored codeword, for example by applying a noniterative decoding algorithm to part or all of the representation of the stored codeword, in preparation for subsequent iterative decoding of that output.

Preferably, the memory is a flash memory.

Preferably, the decoding is effected only if the representation of the stored codeword is in error and the method includes the step of determining whether the representation of the stored codeword is in error. Most preferably, the determination of whether the representation of the stored codeword is in error is effected by steps including determining whether the representation of the stored codeword is a member of a set of codewords that includes the stored codeword. If the representation of the stored codeword is not included in that set, the representation of the stored codeword is deemed to be in error. The set of codewords may be either a set of systematic codewords or a set of nonsystematic codewords.

The iterative decoding may be effected using either a hard decoder or a soft decoder.

Preferably, the decoding is iterated until a predetermined criterion is satisfied. In one embodiment of the present invention, the predetermined criterion is a criterion that indicates success of the iterative decoding. Most preferably, such a criterion includes an output of the iterative decoding being a member of a set of codewords, either systematic codewords or nonsystematic codewords, that includes the stored codeword. Another, less preferable criterion for success includes the output of an iterative decoding iteration being identical to the input to that iteration. Alternatively, the predetermined criterion is a criterion that indicates failure of the iterative decoding. Most preferably, such a criterion includes a maximum number of iterations of the iterative decoding algorithm.

According to a second basic method of the present invention, data are encoded as a codeword. The codeword is stored in a memory. A representation of the codeword is read from the memory. Then, a plurality of bits related to the representation of the codeword is decoded iteratively. The plurality of bits related to the representation of the stored codeword could be part or all of the stored codeword itself or could be part or all of the results of processing part or all of the stored codeword.

Preferably, the memory is a flash memory. The encoding of the data may be either systematic encoding or nonsystematic encoding.

The scope of the present invention also includes a controller, of a memory wherein is stored a representation of a codeword, that recovers the codeword using the first method of the present invention, a memory device that includes a memory for storing a representation of a codeword and a controller of the present invention, and a system for storing data that includes a memory device for storing the data as a representation of the codeword and a processor that recovers the data using the first method of the present invention.

BRIEF DESCRIPTION OF THE DRAWINGS

The invention is herein described, by way of example only, with reference to the accompanying drawings, wherein:

FIGS. 1A-1D show threshold voltage distributions in a one-bit flash cell, a two-bit flash cell, a three-bit flash cell and a four-bit flash cell;

DESCRIPTION OF THE PREFERRED EMBODIMENTS

Figure 2:
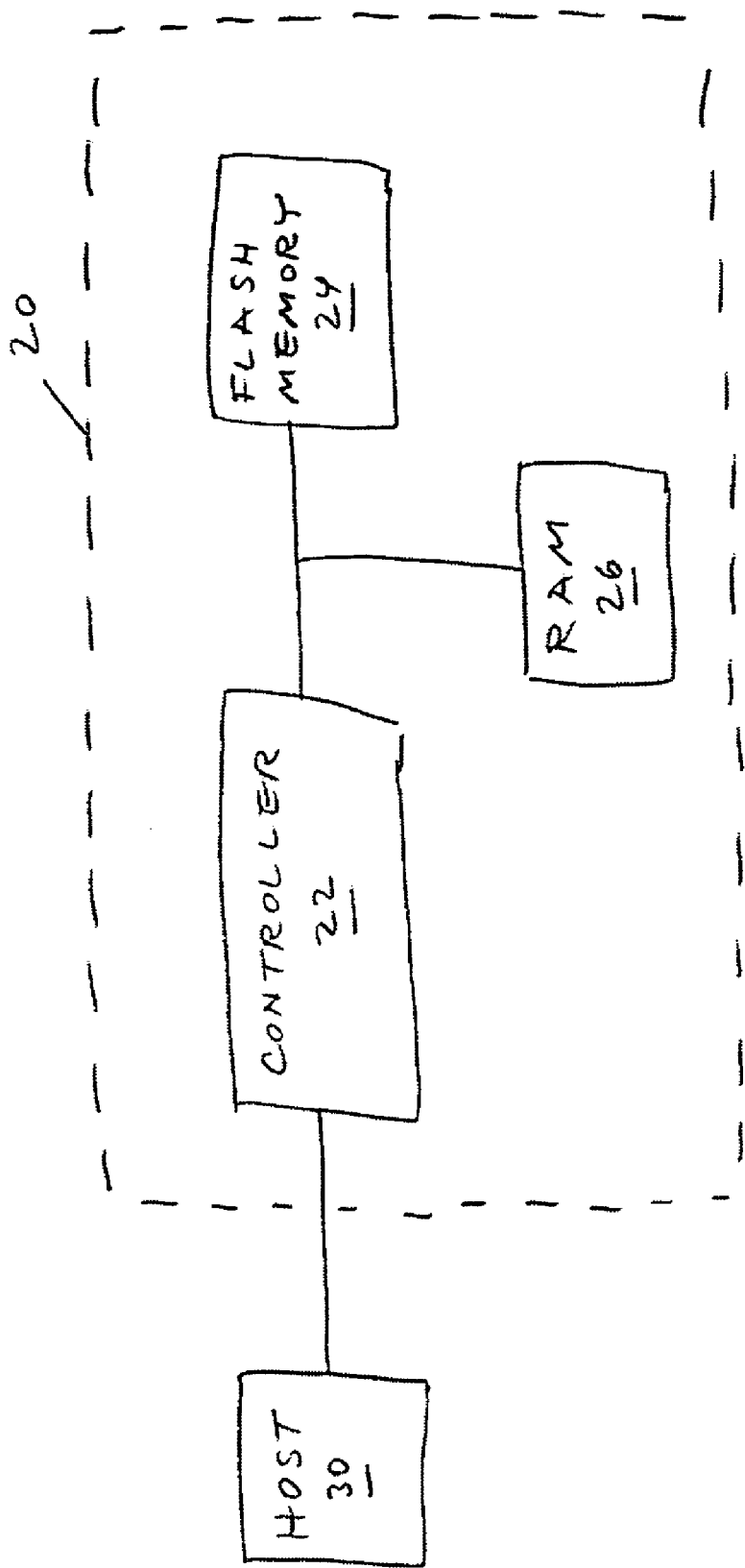
FIG. 2 is a high-level block diagram of a flash memory device of the present invention.

The principles and operation of a flash memory decoder according to the present invention may be better understood with reference to the drawings and the accompanying description.

The present invention uses iterative decoders in the ECC employed in flash memory storage systems that use MBC flash memory devices. The method of the present invention operates as follows:

a. User data are provided by an external host computer to a flash memory storage system of the present invention in order to be stored for later recall.

b. The encoder part of an ECC module of the storage system encodes the user data into a codeword that is a representation of the user data plus some extra information that allows overcoming errors in the data should such errors occur. Typically the stored codeword includes the original user data bits plus some parity bits that are computed based on the user data bits. The encoding may be done using any ECC algorithm known in the art, as long as there is a corresponding iterative decoding algorithm capable of decoding the codeword.

c. The codeword is stored into the memory device.
d. The host computer requests the retrieval of the user data.
e. The codeword bits are read out of the storage cells, potentially with errors in some of the bits compared to the originally stored bits. The read bits include bits corresponding to both the user data bits and the parity bits.
f. The decoder part of the ECC module of the storage system decodes the read bits using an iterative decoding algorithm. When eventually the success criterion of the iterative decoder is met, the last potential value of the user data (which was produced in the last iteration and for which the criterion is met) is declared as the decoded user data. The decoding may be done using any iterative decoding algorithm known in the art, as long as that iterative decoding algorithm matches the encoding algorithm used for generating the codeword.
g. The decoded user data are returned to the host computer.
h. If in step "f" the success criterion is not met until a failure criterion is met, the decoding is considered to have failed. The failure criterion may be a limit on the number of decoding iterations or it may be a limit on the decoding time, or some other criterion. In case of decoding failure the designer may choose between returning an error indication to the host computer or returning incorrect data to the host computer without providing an error indication. If the ECC algorithm is appropriately chosen for the reliability characteristics of the flash media, such decoding failure will be extremely rare and can be ignored.

It should be noted that the number of iterations executed by the decoder is not fixed and may depend both on the number of errors and the specific value of the user data. For example, one invocation of the iterative decoder may execute only two iterations before meeting the success criterion and converging to the correct decoded data, while another invocation of the same decoder may execute fifteen iterations for producing the same results, even though the decoded user data are the same in both invocations. This might happen if the first invocation had to deal with a small number of errors while the second invocation had to deal with a large number of errors. But, even with an equal number of errors in two invocations of the decoder, the number of iterations need not be the same if the user data are not the same.

It should also be noted that the iterative decoder may stop after only a single iteration or even after no iterations at all. For example, the codeword typically is a member of a set of allowed codewords. If the read bits correspond to a member of this set, it is assumed that the read bits were originally encoded as the codeword to which the read bits correspond, and no further decoding is needed. This is the usual case in which the input to the decoder has no errors at all, in which case the success criterion is met without a need for any other computation except the testing of the success criterion. In practice, the number of allowed codewords almost always is far too large for the read bits to be compared directly to the set of allowed codewords to determine whether the read bits belong to that set. Instead, it is checked whether the read bits satisfy a certain mathematical condition that is equivalent to membership in the set. Fir example, if the code used is a linear code, a necessary and sufficient condition for a column vector d of read bits to be a codeword is that d satisfy an equation of the form $Hd=0$, where H is a constant matrix that depends on the code used, 0 is a column vector of zeros, and the "additions" in the matrix-vector multiplication are XOR operations. The same holds, in case the read bits do not correspond to a member of the set of allowed codewords, for determining whether the output of each iteration is a member of the set. Satisfaction of the condition that the output of an iteration is a member of the set is the criterion for success.

Another criterion for nominal success is that the current iteration does not change its input. This is a less preferable criterion than the output of an iteration being a member of a set of allowed codewords, because all that no change to the input means, for some iterative decoding algorithms, is that there may be no point in continuing to apply the present decoding algorithm.

It should further be noted that the recovering of the user data from the codeword may rely on additional inputs beyond the read bits themselves, such as error probabilities, error distributions or other information, whether pre-defined or determined at decoding execution time. See, for example, U.S. Patent Application Publication Ser. No. 2007/0086239, to Litsyn et al., which is incorporated by reference for all purposes as if fully set forth herein. The present invention is applicable in the context of either "hard" decoders, that operate on just the read bits themselves, or "soft" decoders, that operate on both the read bits and estimates of the probabilities of these bits being in error. The innovation of the present invention lies in the use of an iterative decoder as part of reading data from flash memory storage systems, regardless of whether additional inputs beyond the read bits are also used for generating the decoded user data.

It should further be noted that the recovering of the user data from the codeword may rely on additional inputs beyond the read bits themselves, such as error probabilities, error distributions or other information, whether pre-defined or determined at decoding execution time. See, for example, U.S. patent application Ser. No. 11/339,571, to Litsyn et al., which is incorporated by reference for all purposes as if fully set forth herein. The present invention is applicable in the context of either "hard" decoders, that operate on just the read bits themselves, or "soft" decoders, that operate on both the read bits and estimates of the probabilities of these bits being in error. The innovation of the present invention lies in the use of an iterative decoder as part of reading data from flash memory storage systems, regardless of whether additional inputs beyond the read bits are also used for generating the decoded user data.

By using iterative decoding, the ECC can cost-effectively correct a higher number of errors in the data than is typically possible with non-iterative decoders for a similar level of output reliability. Even though the complexity of the iterative decoder might be higher than the complexity of a non-iterative decoder, this added cost easily pays itself back by enabling the use of MBC flash memory systems with a large number of bits per cell. Such MBC systems that store three or four or even higher number of bits per cell provide for a lower cost per bit than either SBC or two-bits-per-cell MBC storage systems, and this cost reduction easily outweighs the extra cost of the iterative decoder.

So far, the present invention has been presented in the context of error correction schemes that are "systematic". In systematic error correction coding, the original data bits are preserved by the encoding process and can be identified within the bits stored. In other words, the error correction mechanism takes the original data bits, appends to these bits some parity bits, and stores both data bits and parity bits. Later, when reading the stored bits, both the data bits and the parity bits are read, and the parity bits enable the correction of errors in the read data bits, thus regenerating the original data bits.

However, the present invention is equally applicable to non-systematic error correction codes. In such codes the original data bits are not preserved and are not stored. Instead, the encoding process transforms the original data bits into a larger group of bits that are the bits actually stored (herein called "the protected data bits"). When reading the stored protected data bits the original data bits are re-generated, even if there are errors in the protected data bits. The defining characteristic of non-systematic codes is that there is no direct correspondence between a specific original data bit and a specific stored bit. An original data bit is "scattered" in multiple stored bits, and only the combination of those multiple stored bits reveals the value of the original bit.

Referring again to the drawings, FIG. 2 is a high-level block diagram of a flash memory device 20 of the present invention, coupled to a host 30. FIG. 2 is adapted from FIG. 1 of Ban, U.S. Pat. No. 5,404,485, which patent is incorporated by reference for all purposes as if fully set forth herein. Flash memory device 20 includes a flash memory 24, a controller 22 and a random access memory (RAM) 26. Controller 22, that corresponds to "flash control 14" of U.S. Pat. No. 5,404,485, manages flash memory 24, with the help of RAM 26, as described in U.S. Pat. No. 5,404,485. Flash memory 24 encodes data, two or more bits per cell of flash memory 24, as described in U.S. Pat. No. 6,522,580 or in U.S. Pat. No. 6,643,188, either as a systematic codeword or as a nonsystematic codeword. When reading the data, controller 22 applies error correction as described above.

Figure 3:
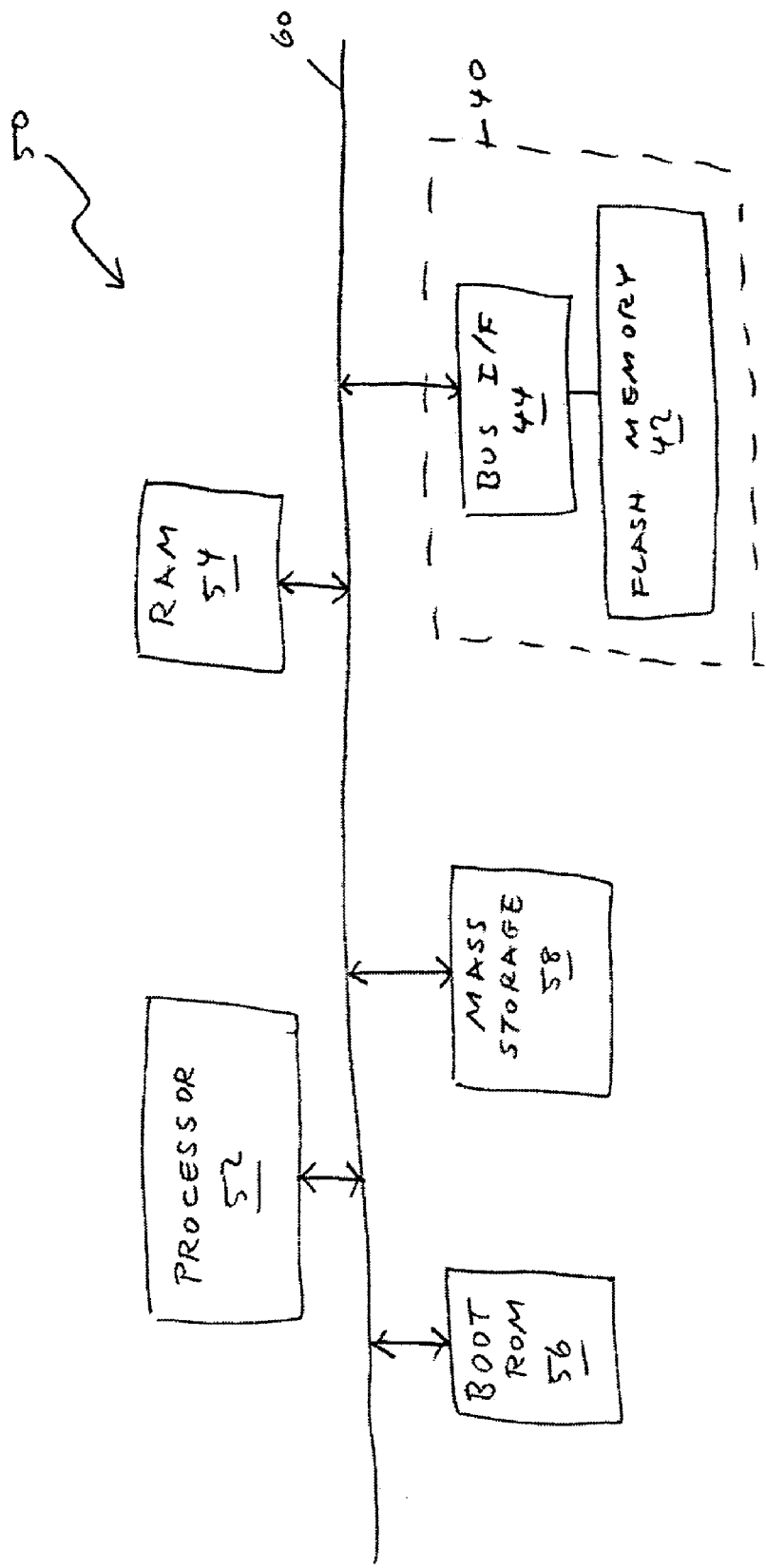
FIG. 3 is a high-level partial block diagram of a data storage system of the present invention.

FIG. 3 is a high-level partial block diagram of an alternative data storage system 50 of the present invention. Data storage system 50 includes a processor 52 and four memory devices: a RAM 54, a boot ROM 56, a mass storage device (hard disk) 58 and a flash memory device 40, all communicating via a common bus 60. Like flash memory device 20, flash memory device 40 includes a flash memory 42. Unlike flash memory device 20, flash memory device 40 lacks its own controller and RAM. Instead, processor 52 emulates controller 22 by executing a software driver that implements the methodology of U.S. Pat. No. 5,404,485 in the manner e.g. of the TrueFFS™ driver of M-Systems Flash Disk Pioneers Ltd. of Kfar Saba, Israel. Flash memory 42 encodes data, two or more bits per cell of flash memory 42, as described in U.S. Pat. No. 6,522,580 or in U.S. Pat. No. 6,643,188, either as a systematic codeword or as a nonsystematic codeword. When reading the data, processor 52 applies error correction as described above. Flash memory device 40 also includes a bus interface 44 to enable processor 52 to communicate with flash memory 42.

The code of the software driver that processor 52 executes to manage flash memory 42 is stored in mass storage device 58 and is transferred to RAM 54 for execution. Mass storage device 58 thus is an example of a computer-readable code storage medium in which is embedded computer readable code for managing flash memory 42 according to the principles of the present invention.

While the invention has been described with respect to a limited number of embodiments, it will be appreciated that many variations, modifications and other applications of the invention may be made. The scope of the present invention includes methods for reading data bits from an MBC flash memory device, as described above The scope of the present invention also includes a controller, for a MBC memory, that recovers data stored in the memory using one of the methods of the present invention, a memory device that includes a MBC memory and a controller of the present invention, and a computer-readable storage medium having embodied thereon computer-readable code for managing a memory according to one of the methods of the present invention.

Furthermore, even though the primary intended application of the present invention is to MBC flash memories, it will be appreciate that the present invention also is applicable to SBC flash memories, or indeed to memories generally, whether based on flash technology or some other technology, and whether non-volatile or volatile.

While the invention has been described with respect to a limited number of embodiments, it will be appreciated that many variations, modifications and other applications of the invention may be made.

What is claimed is:

1. A method of processing a representation of a stored codeword, comprising the steps of:
    (a) reading the representation of the stored codeword from a memory wherein the stored codeword is stored; and
    (b) iteratively decoding a plurality of bits related to the representation of the stored codeword.

2. The method of claim 1, wherein said plurality of bits is at least a portion of the representation of the stored codeword.

3. The method of claim 1, wherein said plurality of bits is at least a portion of an output of processing of at least a portion of the representation of the stored codeword.

4. The method of claim 1, wherein said memory is a flash memory.

5. The method of claim 1, wherein said iterative decoding is effected using a hard decoder.

6. The method of claim 1, wherein said iterative decoding is effected using a soft decoder.

7. The method of claim 1, wherein said iterative decoding is iterated until a predetermined criterion is satisfied.

8. The method of claim 7, wherein said predetermined criterion indicates success of said iterative decoding.

9. The method of claim 7, wherein said predetermined criterion indicates failure of said iterative decoding.

10. The method of claim 9, wherein said predetermined criterion includes a maximum number of iterations.

11. A controller, of a memory wherein a codeword has been stored, the controller comprising an iterative decoder for decoding a plurality of bits related to a representation of the codeword as read from the memory.

12. The controller of claim 11 wherein said iterative decoder is implemented in hardware.

13. The controller of claim 11, wherein said iterative decoder is implemented in software.

14. The controller of claim 11, wherein said iterative decoder is implemented in a combination of hardware and software.

15. A memory device comprising:
    (a) a memory for storing a codeword therein; and
    (b) a controller operative to iteratively decode a plurality of bits related to a representation of said codeword as read from said memory.

16. A system for storing data, comprising:
    (a) a memory device for storing the data therein as a codeword; and
    (b) a processor operative to iteratively decode a plurality of bits related to a representation of said codeword as read from said memory.

17. A method of processing data, comprising the steps of:
    (a) encoding the data as a codeword;
    (b) storing said codeword in a memory;
    (c) reading a representation of said codeword from said memory; and
    (d) iteratively decoding a plurality of bits related to said representation of said codeword.

18. The method of claim 17, wherein said plurality of bits is at least a portion of said representation of said codeword.

19. The method of claim 17, wherein said plurality of bits is at least a portion of an output of processing of at least a portion of said representation of said codeword.

20. The method of claim 17, wherein said memory is a flash memory.

21. The method of claim 17, wherein said encoding is systematic encoding.

22. The method of claim 17, wherein said encoding is nonsystematic encoding.

23. A method of processing a representation of a stored codeword, comprising the steps of:
   (a) reading the representation of the stored codeword from a memory wherein the stored codeword is stored;
   (b) determining whether the representation of the stored codeword is in error; and
   (c) only if the representation of the stored codeword is in error: iteratively decoding a plurality of bits related to the representation of the stored codeword.

24. The method of claim 23, wherein said determining is effected by steps including determining whether the representation of the stored codeword is a member of a set of codewords that includes the stored codeword.

25. The method of claim 24, wherein said set is a set of systematic codewords.

26. The method of claim 24, wherein said set is a set of nonsystematic codewords.

27. A method of processing a representation of a stored codeword, comprising the steps of:
   (a) reading the representation of the stored codeword from a memory wherein the stored codeword is stored; and
   (b) iteratively decoding a plurality of bits related to the representation of the stored codeword until an output of said decoding is a member of a set of codewords that includes the stored codeword.

28. The method of claim 27, wherein said set is a set of systematic codewords.

29. The method of claim 27, wherein said set is a set of nonsystematic codewords.

30. A method of processing a representation of a stored codeword, comprising the steps of:
   (a) reading the representation of the stored codeword from a memory wherein the stored codeword is stored; and
   (b) iteratively decoding a plurality of bits related to the representation of the stored codeword until an output of an iteration of said decoding is identical to an input of said iteration.

31. A controller, of a memory wherein is stored a representation of a codeword, the controller comprising an iterative decoder for:
   (a) determining whether the representation of the codeword is in error; and
   (b) only if the representation of the codeword is in error: iteratively decoding a plurality of bits related to the representation of the codeword.

32. A controller, of a memory wherein is stored a representation of a codeword, the controller comprising an iterative decoder for iteratively decoding a plurality of bits related to the representation of the codeword until an output of an iteration of said decoding is a member of a codeword set that includes the codeword.

33. A controller, of a memory wherein is stored a representation of a codeword, the controller comprising an iterative decoder for iteratively decoding a plurality of bits related to the representation of the codeword until an output of an iteration of said decoding is identical to an input of said iteration.

34. A memory device comprising:
   (a) a memory for storing a representation of a codeword; and
   (b) a controller operative to:
      (i) determine whether said representation of said codeword is in error, and
      (ii) only if said representation of said codeword is in error: iteratively decoding a plurality of bits related to said representation of said codeword.

35. A memory device comprising:
   (a) a memory for storing a representation of a codeword; and
   (b) a controller operative to iteratively decode a plurality of bits related to said representation of said codeword until an output of an iteration of said decoding is a member of a codeword set that includes the codeword.

36. A memory device comprising:
   (a) a memory for storing a representation of a codeword; and
   (b) a controller operative to iteratively decode a plurality of bits related to said representation of said codeword until an output of an iteration of said decoding is identical to an input of said iteration.

37. A system for storing data, comprising:
   (a) a memory device for storing the data as a representation of a codeword; and
   (b) a processor operative to:
      (i) determine whether said representation of said codeword is in error, and
      (ii) only if said representation of said codeword is in error: iteratively decoding a plurality of bits related to said representation of said codeword.

38. A system for storing data, comprising:
   (a) a memory device for storing the data as a representation of a codeword; and
   (b) a processor operative to iteratively decode a plurality of bits related to said representation of said codeword until an output of an iteration of said decoding is a member of a codeword set that includes the codeword.

39. A system for storing data, comprising:
   (a) a memory device for storing the data as a representation of a codeword; and
   (b) a processor operative to iteratively decode a plurality of bits related to said representation of said codeword until an output of an iteration of said decoding is identical to an input of said iteration.

40. A method of processing data, comprising the steps of:
   (a) encoding the data as a codeword;
   (b) storing said codeword in a memory;
   (c) reading a representation of said codeword from said memory; and
   (d) determining whether said representation of said codeword is in error; and
   (e) only if said representation of said codeword is in error: iteratively decoding a plurality of bits related to said representation of said codeword.

41. A method of processing data, comprising the steps of:
   (a) encoding the data as a codeword;
   (b) storing said codeword in a memory;
   (c) reading a representation of said codeword from said memory; and
   (d) iteratively decoding a plurality of bits related to said representation of said codeword until an output of said decoding is a member of a codeword set that includes said codeword.

42. A method of processing data, comprising the steps of:
   (a) encoding the data as a codeword;
   (b) storing said codeword in a memory;
   (c) reading a representation of said codeword from said memory; and
   (d) iteratively decoding a plurality of bits related to said representation of said codeword until an output of an iteration of said decoding is identical to an input of said iteration.

* * * * *

UNITED STATES PATENT AND TRADEMARK OFFICE
CERTIFICATE OF CORRECTION

PATENT NO. : 7,533,328 B2
APPLICATION NO. : 11/607945
DATED : May 12, 2009
INVENTOR(S) : Idan Alrod, Eran Sharon and Simon Litsyn It is certified that error appears in the above-identified patent and that said Letters Patent is hereby corrected as shown below:

Title page

Assignee item (73) should be corrected as follows:

change

-- SanDisk IL, Ltd., Kfar Saba (IL) -- to

"Ramot at Tel Aviv University Ltd., Tel Aviv (IL)"

Signed and Sealed this
Tenth Day of April, 2012

David J. Kappos
*Director of the United States Patent and Trademark Office*